United States Patent [19]
Han et al.

[11] Patent Number: 5,927,504
[45] Date of Patent: Jul. 27, 1999

[54] APPARATUS FOR CARRYING PLURAL PRINTED CIRCUIT BOARDS FOR SEMICONDUCTOR MODULE

[75] Inventors: Seong Chan Han; Dong Chun Lee; Kwang Su Yu; O Kyung Kwon, all of Asan, Rep. of Korea

[73] Assignee: Samsung Electronics Co., Ltd., Kyungki-do, Rep. of Korea

[21] Appl. No.: 09/103,641

[22] Filed: Jun. 23, 1998

[51] Int. Cl.[6] .................................................. B65D 73/00
[52] U.S. Cl. .......................................... 206/706; 206/486
[58] Field of Search .................................. 206/701, 706, 206/707, 708, 486

[56] References Cited

U.S. PATENT DOCUMENTS 5,593,040  1/1997  Shelton et al. ........................... 206/706
5,732,465  3/1998  Tokita et al. ............................. 206/707

Primary Examiner—Jacob K. Ackun
Attorney, Agent, or Firm—Skjerven, Morrill, Macpherson, Franklin & Friel LLP; David T. Millers

[57] ABSTRACT

An apparatus for carrying plural printed circuit boards (PCBs) for semiconductor modules is disclosed. The apparatus comprises a main frame which is formed with an inside space for the PCBs. The main frame includes receivers for supporting one shorter edge of the PCBs. A clamp frame joined to the main frame includes a support plate for the other shorter edge of the PCBs. Movable clamps are elastically connected to the clamp frame so as to push the PCBs by elastic force when the PCBs are loaded into the apparatus. A adjustable mounting such as a slot or holes is provided in the main frame for fasteners joining two frames each other. Therefore, the apparatus can carry the PCBs of different size. The elastic connection between the clamp and the clamp frame is preferably made by slide bars and elastic members. Clamp holes, sub-walls, partition walls, hollow corners, and so forth may be preferably provided for the apparatus.

10 Claims, 6 Drawing Sheets

APPARATUS FOR CARRYING PLURAL PRINTED CIRCUIT BOARDS FOR SEMICONDUCTOR MODULE

BACKGROUND OF THE INVENTION

1. Field of the Invention

The present invention relates generally to an apparatus employed in manufacture of semiconductor modules. More particularly, the present invention relates to an apparatus for carrying multiple printed circuit boards during a process of manufacturing semiconductor modules.

2. Description of the Prior Art

As electronic devices become more complex and employ more integrated circuits, it is desirable, if possible, to avoid increasing the space where they occupy. To solve this problem, modules mounted with plural integrated circuit devices have been employed. In a typical module, the integrated circuit devices, for example, semiconductor packages, are attached to one side or both sides of a printed circuit board (PCB).

For higher productivity, modules are generally produced in a production line where PCBs move along conveyor belt. In particular, sheet-type PCBs are subjected to the manufacturing process of the module, as well known in the art. Each sheet-type PCB has a number of individual PCBs, what are called piece-type PCBs, which are linked with each other at their ends, leaving central isolated space between adjacent individual PCBs. A final module product, which includes a single individual PCB, is obtained by cutting the link part of the sheet-type PCBs after completing the processing of the sheet-type PCBs.

However, the use of the sheet-type PCBs raises some problems. One of them is that the sheet-type PCBs have several wasted parts, such as link part or space. These wasted parts are required to hold the sheet-type during the manufacturing process, but not required by final product. Moreover, although unexpected failures may be found from one or more among the individual PCBs of a sheet-type PCB during the manufacturing process, the failed individual PCBs are still subjected to the final steps of process because of difficulty of removing the failed PCBs before completion of the process. This is a significant drawback in light of productivity.

Accordingly, in recent years, multiple individual PCBs without link parts or space are separated at the beginning of the manufacturing process of the modules. This provides lower per PCB cost than the above-described sheet-type PCB processing since the absence of link parts or space reduces the required amount of raw PCB material. A jig carrier makes this improvement possible. The jig carrier can not only carries a large quantity of individual PCBs, but also ensures better productivity than the sheet-type PCB processing.

FIG. 1 is a perspective view of an existing jig carrier 10 as a conventional apparatus for carrying PCBs 20 for semiconductor modules; and FIG. 2 is a perspective view for schematically showing a typical PCB 20 for a semiconductor module.

As shown in FIGS. 1 and 2, the prior jig carrier 10 comprises a rectangular frame 12 and two opposite plates 14 inside the frame 12. Pins 16 are formed at regular intervals on the plates 14. The PCB 20 is a rectangular panel having two opposite shorter edges 21 and two opposite longer edges 22. The PCB 20 has a great number of circuit patterns, not shown, formed on both top and bottom surfaces thereof, as widely known in the art. The PCB 20 further includes through holes 26 corresponding to the pins 16 of the jig carrier 10.

When the PCB 20 is on the jig carrier 10, the plates 14 of the jig carrier 10 support the bottom surface of the PCB 20, and the pins 16 are inserted into the through holes 26. After all PCBs 20 are loaded into the jig carrier 10, adhesive tape 18 is stuck to both top surfaces of the PCB 20 and the jig carrier 10, so that the PCB 20 is completely fixed to the jig carrier 10.

Many kinds of PCBs 20 are employed for the modules. There are different sizes for PCBs 20 as well. Accordingly, PCBs of different sizes typically require different jig carriers 10. The use of a particular jig carrier 10 is limited by the fixed size of its frame 12 and the fixed positions of its pins 16. Another disadvantage of the existing jig carrier 10 is that the attaching of the tape 18 and the loading of the PCBs 20 are done manually. In addition, when the module has double-sided devices, the adhesive tapes 18 must be removed from the PCBs 20 and then the PCBs 20 are flipped over for attaching of devices onto the back side of the PCB 20. This manual manipulation of the PCBs can lower productivity of the module manufacturing process.

SUMMARY OF THE INVENTION

It is therefore an object of the present invention to provide an improved apparatus for carrying printed circuit boards of all sizes for semiconductor module.

It is another object of the present invention to provide an improved apparatus allowing automatic loading/unloading of printed circuit boards for semiconductor module.

These and other objects in accordance with the present invention are attained by an apparatus which has elastically movable clamps and an adjustable mounting for the clamps. The apparatus according to the present invention carries a plurality of printed circuit boards (PCBs) for semiconductor modules. Each PCB has two opposite shorter edges and two opposite longer edges.

The apparatus in accordance with an embodiment of the present invention includes a rectangular main frame which is formed with an inside space for the PCBs. The main frame includes an inside wall which has a plurality of receivers corresponding to the PCBs. A first shorter edge of each PCB is accommodated in each receiver of the main frame.

The apparatus further includes a clamp frame which is mechanically attached to the main frame by at least one fastener. The clamp frame has a support plate for a second shorter edge that is opposite to the first short edge of each PCB. Moreover, the clamp frame has a fixed wall opposite to the support plate.

The apparatus may further include at least one movable clamp which is located in the inside space of the main frame. Each movable clamp is also elastically connected to the fixed wall of the clamp frame so as to push the second shorter edge of the PCBs toward the receivers of the main frame. Accordingly, the PCBs are fixed by both the movable clamps and the main frame.

The main frame of the invented apparatus provides the adjustable mounting that allows movement of the fasteners. Accordingly, the apparatus can carry the PCBs of different sizes (e.g. lengths along the longer edge.) The adjustable mounting is preferably provided by either a locking slot or a plurality of locking holes, which are formed in the main frame in both parallel sides that are perpendicular to the side of the receivers.

The elastic connection between the clamps and the clamp frame is preferably made by one or more slide bars and corresponding elastic members. Each slide bar is horizontally inserted to both the fixed wall and the support plate of the clamp frame. Each slide bar also horizontally penetrates each movable clamp, so that the movable clamps can move along the slide bars. Each elastic member is added to the slide bar between the fixed wall of the clamp frame and the clamp, so that the clamps can push the PCBs by elastic force of the elastic members.

An opening element may move the movable clamps in the direction of the fixed wall of the clamp frame when the PCBs are between the support plate of the clamp frame and the receivers of the main frame. Each of the movable clamps may have one or more holes vertically formed therethrough, and the opening element may have multiple opening pins to be inserted into corresponding holes in the clamps. The opening pins can apply a mechanical force to move the movable clamps.

The receivers of the main frame may be preferably divided by a plurality of sub-walls provided thereon. Therefore, a respective one of the sub-walls together with the respective inside wall and receiver can support a respective one of the PCBs. Furthermore, the clamp frame may include a plurality of partition walls which are on the support plate thereof and correspond to the sub-walls. Therefore, a respective one of the partition walls together a support plate and a movable clamp can support a respective one of the PCBs.

According to an alternate aspect of the present invention, each inside wall and each sub-wall, which define a respective one of the receivers of the main frame, may have hollow corners.

BRIEF DESCRIPTION OF THE DRAWINGS

In the drawings, like numbers refer to like elements throughout.

DETAILED DESCRIPTION OF THE PRESENT INVENTION

The present invention will now be described more fully hereinafter with reference to accompanying drawings, in which preferred embodiments of the invention are shown. This invention may, however, be embodied in many different forms and should not be construed as limited to the embodiments set forth herein.

Figure 1:
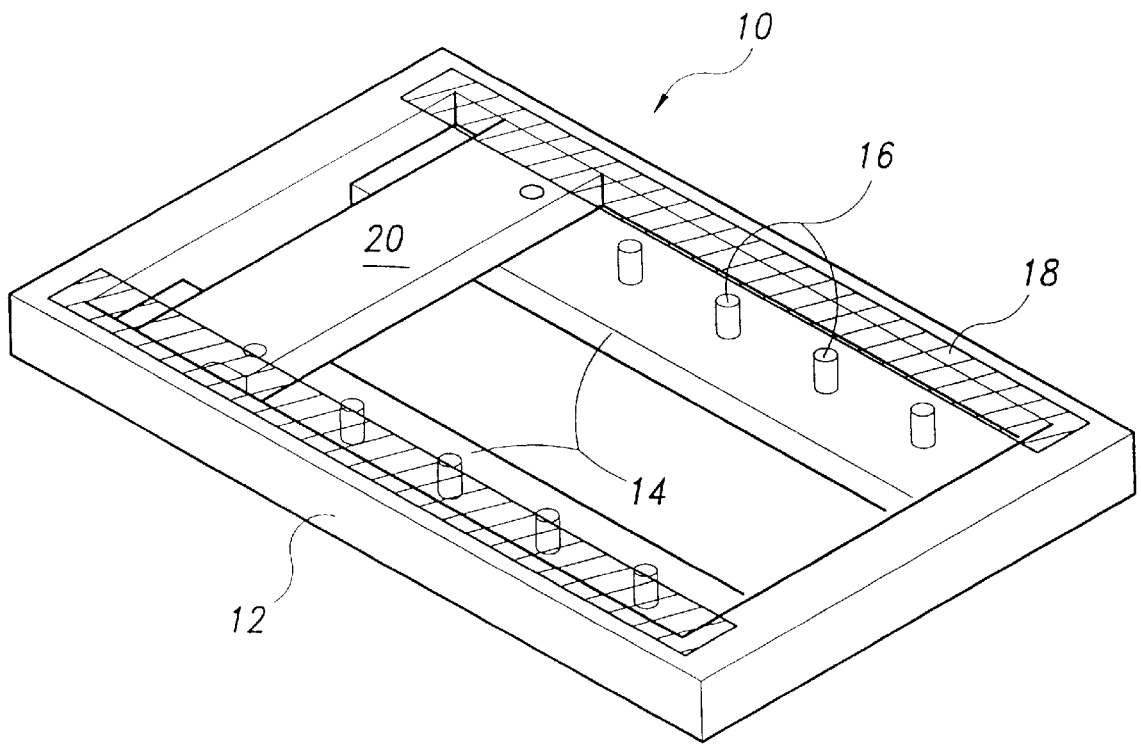
FIG. 1 is a perspective view of a conventional apparatus for carrying printed circuit boards for manufacture of semiconductor modules.
Figure 2:
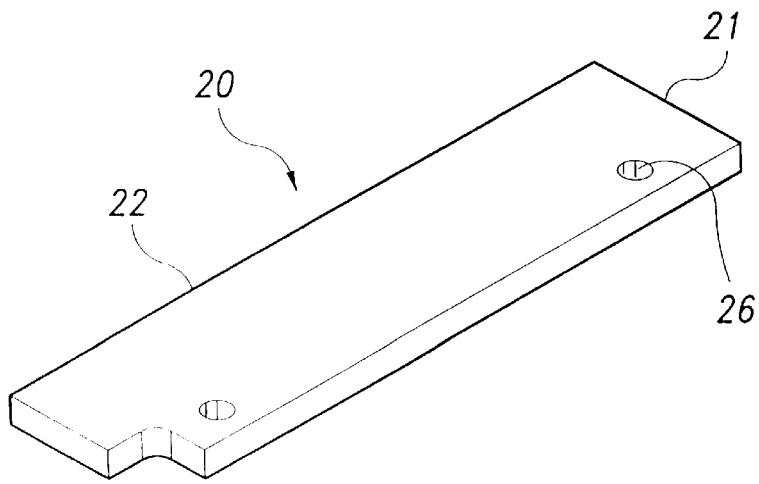
FIG. 2 is a perspective view for schematically showing a typical printed circuit board for a semiconductor module.
Figure 3:
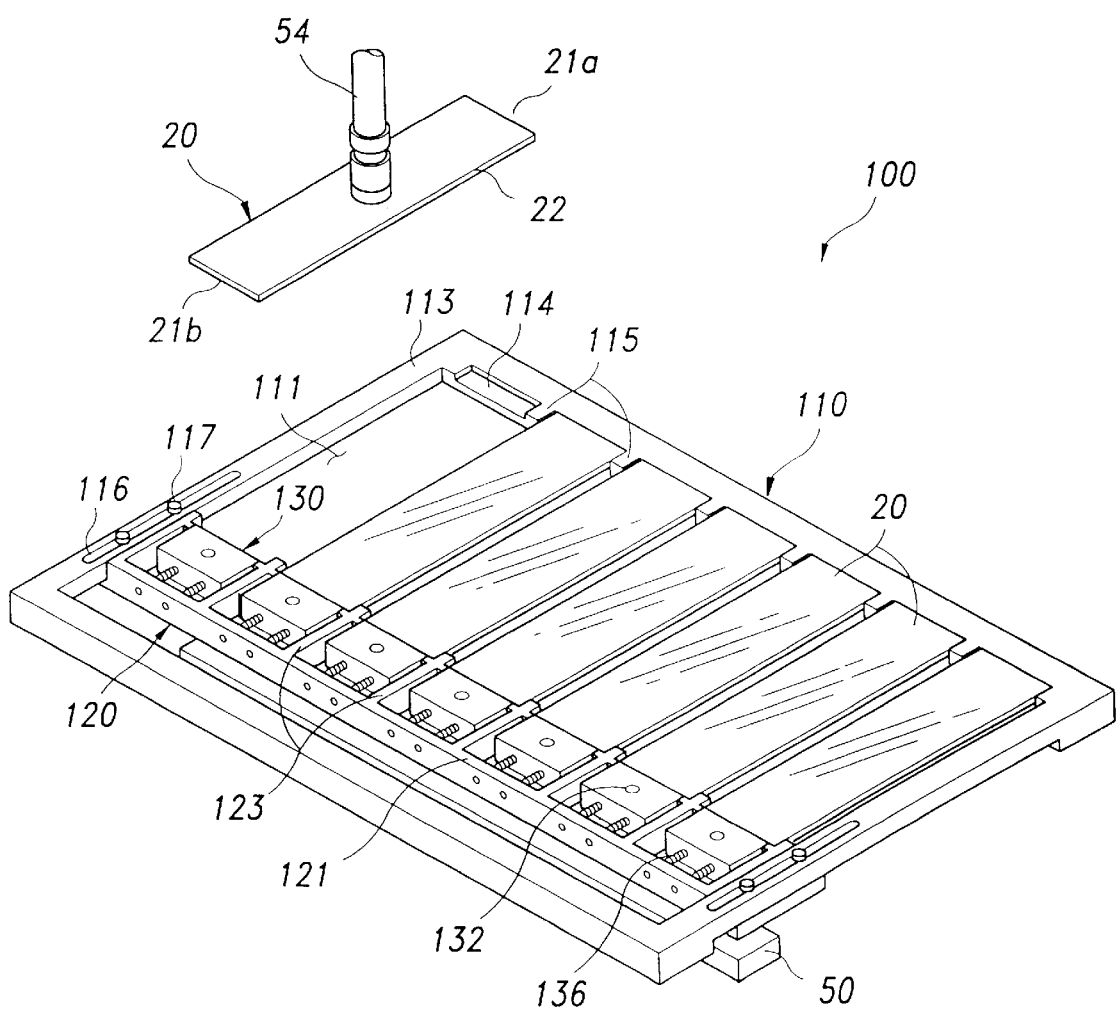
FIG. 3 is a perspective view of one embodiment of an apparatus according to the invention for carrying printed circuit boards for manufacture of semiconductor modules.
Figure 4:
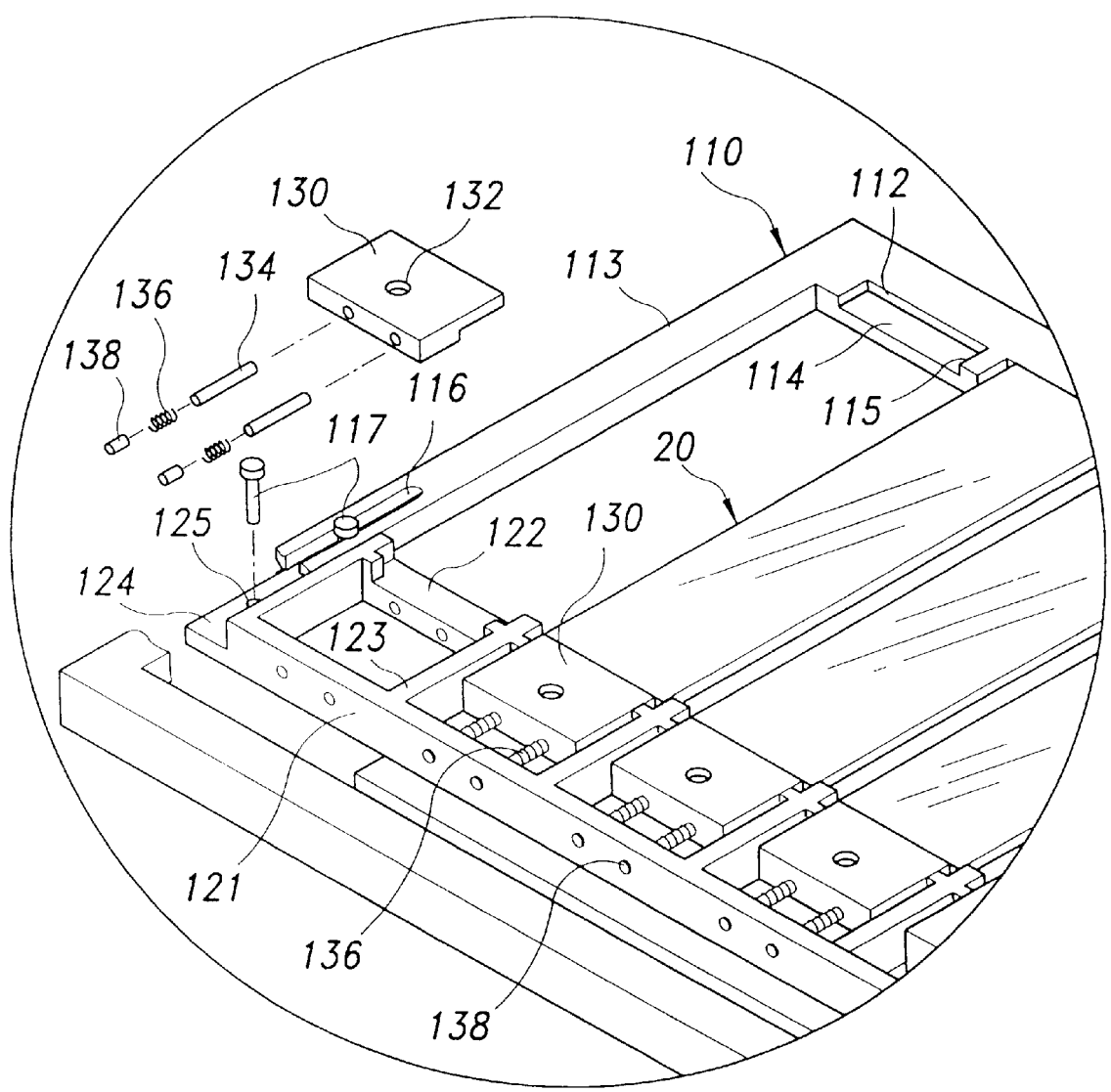
FIG. 4 is a perspective view, partially exploded and partially cut away, of the apparatus shown in FIG. 3.

FIG. 3 is a perspective view of one embodiment of an apparatus according to the present invention, for carrying printed circuit boards (PCBs) 20 for manufacture of semiconductor modules; and FIG. 4 is a perspective view, partially exploded and partially cut away, of the apparatus 100 shown in FIG. 3. Referring to FIGS. 3 and 4, so called a jig carrier 100 carries a plurality of module PCBs 20, each of which has two opposite shorter edges 21 and two opposite longer edges 22, as also shown in FIG. 2.

The jig carrier 100 comprises a rectangular main frame 110, a clamp frame 120 and at least one clamps 130. Clamps 130 are preferably of the same number as the PCBs 20. The main frame 110 is formed with an inside space 111 where the PCBs 20 are kept. When the PCBs 20 are loaded into the jig carrier 100, a first shorter edge 21a of each PCB 20 is accommodated in a respective one of receivers 114 which are in an inside wall 112 of the main frame 110. The receivers 114 are preferably notches or ledges that are separated by sub-walls 115, and thus each of the sub-walls 115 together with a respective receiver 114 and wall 112 can support a respective one of the PCBs 20. The width of each receiving part 114, which is determined by two adjacent sub-walls 115, is preferably greater than that of the shorter edge 21 of the PCB 20. This permits the jig carrier 100 to admit various PCBs 20 having different sizes for shorter edge 21.

The clamp frame 120 is mechanically joined to the main frame 110 by at least one fasteners 117. Preferable joints between two frames 110 and 120 are made at both parallel sides 113 of the main frame 110 and both ends 124 of the clamp frame 120. On both sides 113, each of which is perpendicular to the side of the receivers 114 of the main frame 110, an adjustable mounting such as a locking slot 116 is formed for the fasteners 117. On both ends 124 of the clamp frame 120, one or more holes 125 are formed for the fasteners 117. Therefore, the locations of the fasteners 117 are limited to the holes 125 in the clamp frame 120, but can freely move in the locking slot 116 of the main frame 110. Thus, the clamp frame 120 has a certain degree of freedom of movement within the slot 116. This allows adjustment of the jig carrier 100 for PCBs 20 of different lengths along the longer edge 22. This is one of specific features of the apparatus according to the present invention.

Figure 6A:
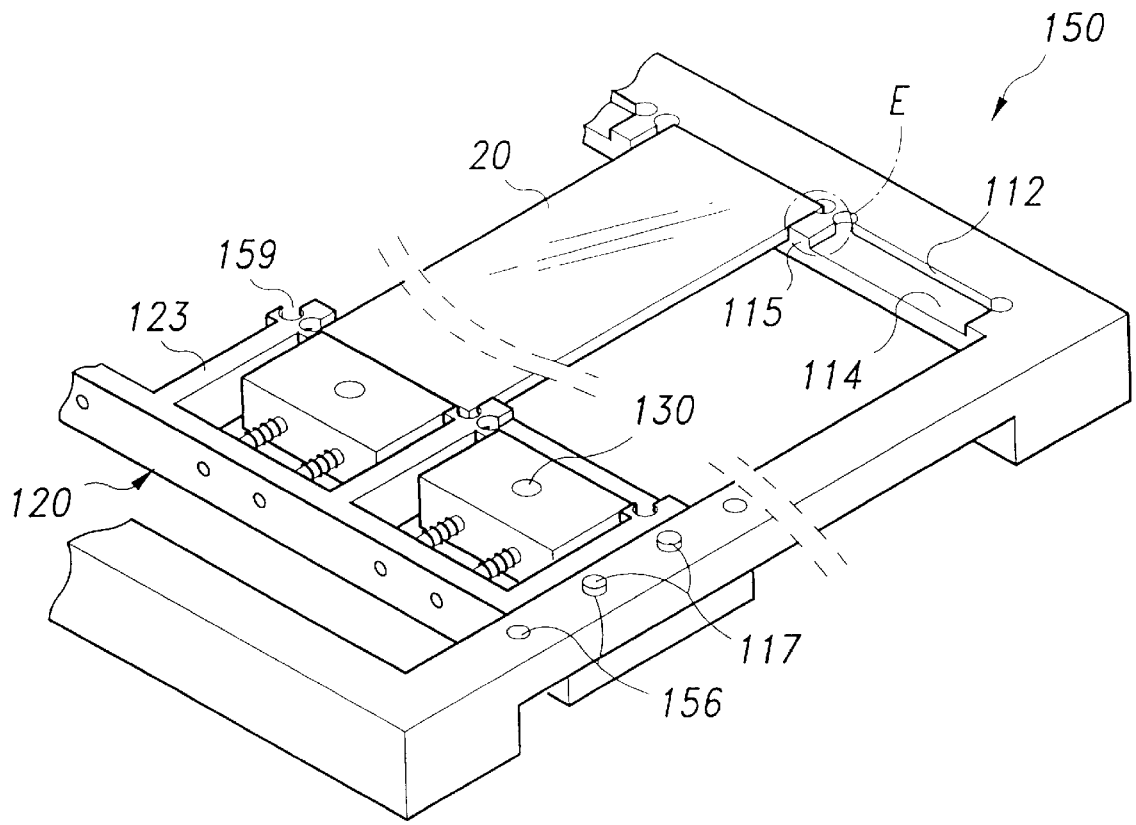
FIGS. 6A and 6B are perspective views partially showing another embodiment of an apparatus according to the present invention.

As shown in FIG. 6A, a plurality of locking holes 156 can be alternatively used in the adjustable mounting in place of a slot. In this case, although the locking holes 156 provide a less free movement of the clamp frame 120 than the above locking slot, locking holes 156 simplify the task of adjusting the location of the clamp frame 120 according to the size of the PCB 20. To adjust jig 210, holes 125 in clamp frame 120 are aligned with holes 156, and pins 117 are inserted through aligned holes 125 and 156 to lock clap frame 120 in place. The locking holes 156 are formed at regular intervals so that jig 110 can accommodate a range of PCB lengths.

Returning to FIGS. 3 and 4, the clamp frame 120 includes a fixed wall 121 and a support plate 122, both of which traverse the inside space 111 in parallel with the side of the receivers 114 of the main frame 110. The support plate 122 is provided for supporting a second shorter edge 21b which is opposite to the first edge 21a of the PCBs 20. The fixed wall 121 connects to and suspends the clamps 130. The clamps 130 are described further below.

The support plate 122 is preferably provided with plural partition walls 123 thereon. Each partition wall 123 corresponds to a respective one of the sub-walls 115 of the main frame 110. Therefore, when a certain PCB 20 is loaded into the jig carrier 100, both the partition wall 123 and the sub-wall 115 can support the longer edge 22 of the PCB 20, while the support plate 122 and the receiving part 114 support a bottom surface near the shorter edges 21a and 21b. Similar to the sub-walls 115, the distance of two adjacent partition walls 123 is preferably greater than the width of the shorter edge 21 of the PCB 20. Accordingly, if the PCB 20 has a smaller width, the PCB 20 is supported by the only one of two adjacent partition walls 123 and the only one of two adjacent sub-walls 115.

The clamps 130 are located in the inside space 111 of the main frame 110, more particularly in a space between the fixed wall 121 and the support plate 122. In addition, the clamps 130 are elastically connected to the fixed wall 121 by elastic connectors. The elastic connectors between the clamps 130 and the clamp frame 120 are preferably made of slide bars 134 and elastic members 136 such as springs.

Each slide bar 134 is horizontally inserted to the support plate 122, penetrates the clamp 130, and is horizontally fixed to the fixed wall 121 by plugs 138. Therefore, the clamps 130 may freely move along the slide bars 134. However, the movement of the movable clamps 130 is limited by the elastic members 136 which are added to the slide bars 134 between the clamp 130 and the fixed wall 121. That is to say, the clamps 130 are pushed by elastic force of the elastic members 136, rather than being freely moved.

Accordingly, when the PCBs 20 are loaded into the jig carrier 100, the clamps 130 push the second shorter edges 21b of the PCBs 20 toward the receivers 114 of the main frame 110, so that the PCBs 20 are firmly fixed to the jig carrier 100 by both the clamps 130 and the main frame 110. Use of the elastically movable clamps 130 is another feature of the apparatus according to the present invention. Elastically movable clamps 130 facilitate automatic loading or unloading process of the module PCBs. The detailed description follows.

When the PCBs 20 are loaded between the support plate 122 of the clamp frame 120 and the receivers 114 of the main frame 110, the movable clamps 130 move in the direction of the fixed wall 121. The jig carrier 100 opens in the reverse direction of the elastic force. This reverse movement of the clamps 130 is caused by an opening element 50 of a loading machine (not shown). In connection with this, the clamps 130 preferably have holes 132 which are vertically formed therethrough, respectively, and the opening element 50 preferably has opening pins 52 as shown in FIGS. 5A to 5D. The opening pins 52, being inserted into the holes 132, can apply mechanical force to move the clamps 130.

Figure 5A:
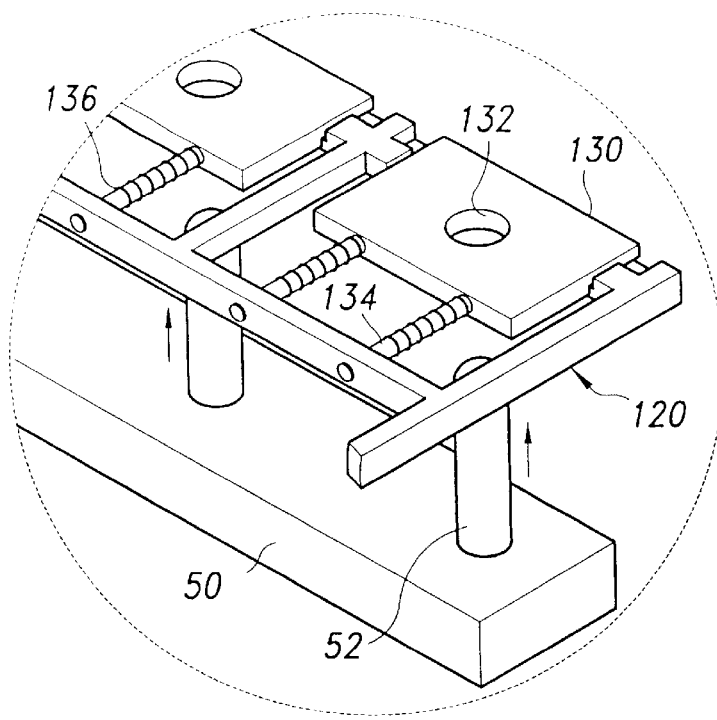
FIGS. 5A to 5D are a sequence of perspective views partially illustrating a process of loading the printed circuit board into the apparatus shown in FIGS. 3 and 4.

A process of automatic loading of the PCBs 20 is depicted in FIGS. 5A to 5D. FIG. 5A shows a state of the clamps 130 in the empty jig carrier 100, namely, before the loading of the PCBs 20. On this occasion, the movable clamps 130 are fully forward, toward the support plate 122. The opening element 50 and the pins 52 remain under the clamps 130.

Figure 5B:
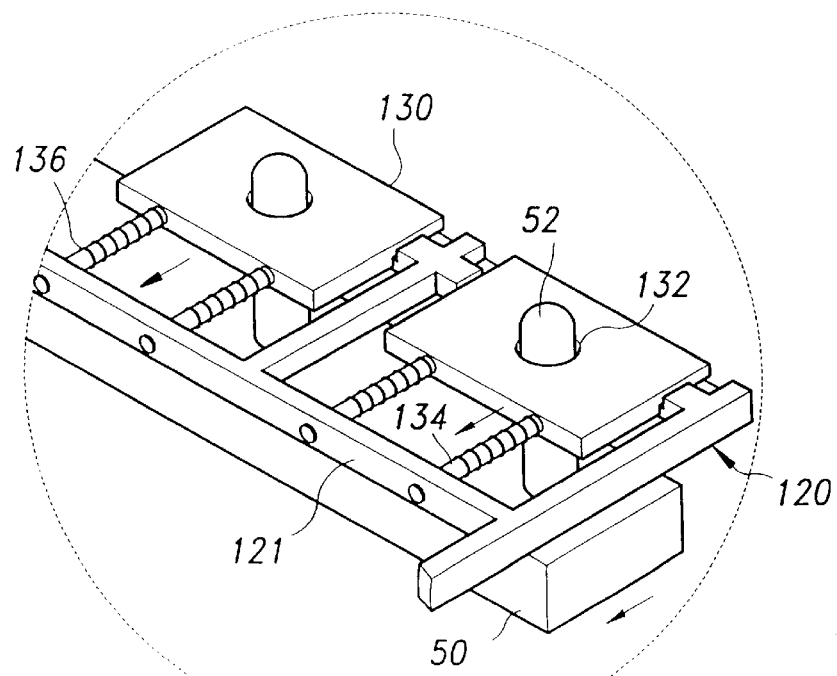

Next, as seen from FIG. 5B, the opening element 50 moves up and the opening pins 52 are inserted into the clamp holes 132 in the clamps 130. At least one PCB 20 is ready to be loaded into the jig carrier 100 by a picker 54 shown in FIG. 3. In succession, the opening element 50 and the pins 52 horizontally move in direction of the fixed wall 121 of the clamp frame 120, so that the clamps 130 also move along the slide bars 134 and compress the elastic members 136.

Figure 5C:
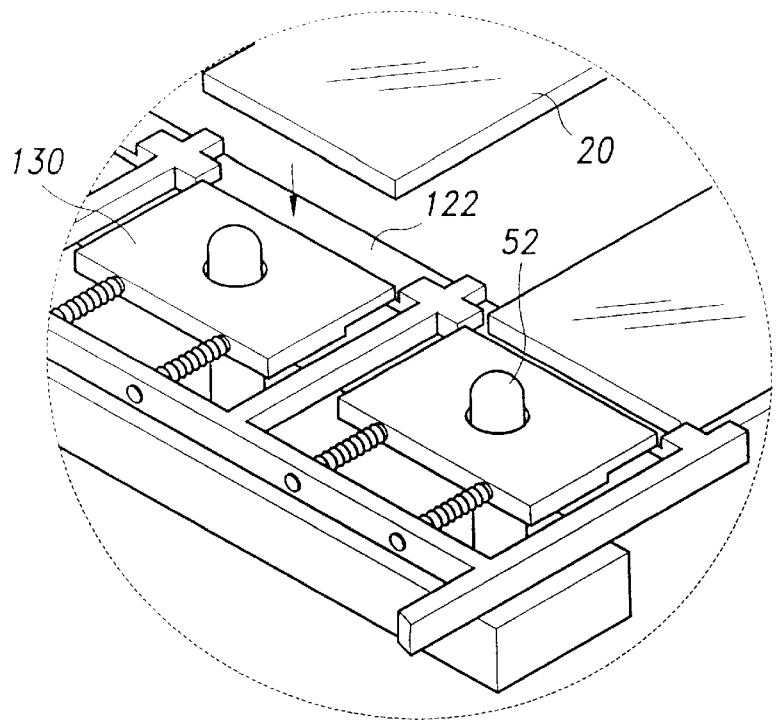

Therefore, as depicted in FIG. 5C, an area enough to admit the PCB 20 is provided between the clamps 130 and the main frame 110. The picker 54 puts a PCB 20 into the jig carrier 100; namely, on the support plate 122 and the receivers 114. Thereafter, the picker 54, illustrated in FIG. 3, repeats same action with respect to the other PCBs 20.

Figure 5D:
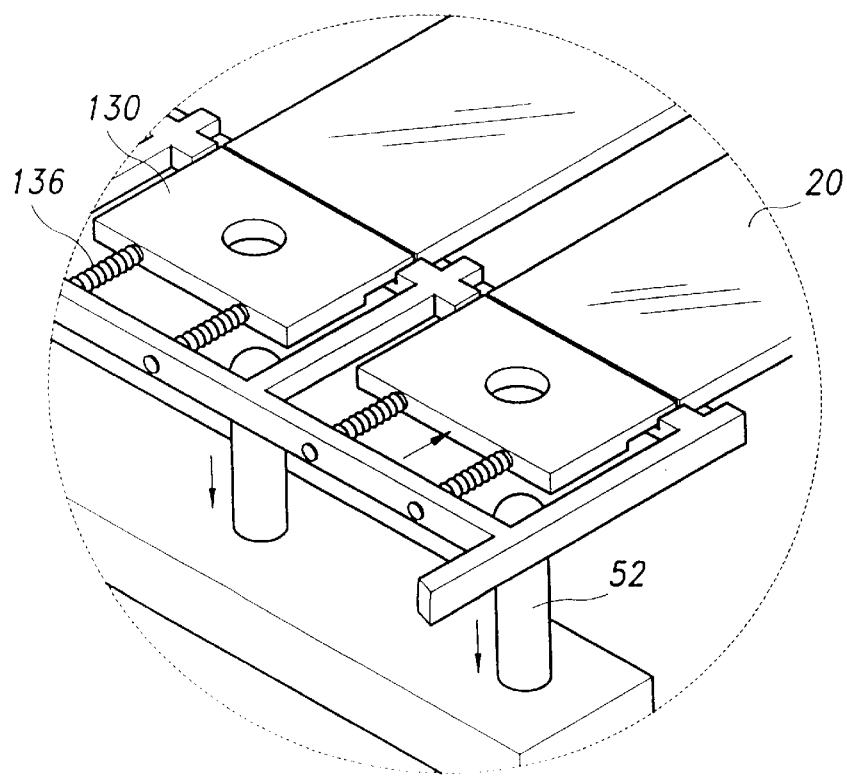

After all the PCBs 20 are loaded into the jig carrier 100, the opening pins 52 move down, as illustrated in FIG. 5D. At the same time, the elastic members 136 push the clamps 130 and the PCBs 20. Accordingly, the PCBs 20 are firmly fixed to the jig carrier 100.

An automatic unloading process can be performed in the reverse order of the above loading process.

Hereinbefore, one embodiment of the invented apparatus has been fully described. As is apparent from the description above, the jig carrier of the present invention can admit different sized PCBs. The use of a single jig carrier for processes having different sized PCBs reduces the cost of module manufacture. Furthermore, the invented jig carrier can provide an automatic loading/unloading process for the module PCBs. The automation of loading/unloading may not only eliminate the possibility of damage during management of the module PCBs, but also prevent the problem associated with electronic discharge from workers. In addition, the use of the elastic movable clamps without using previously adhesive tapes for fixing the PCBs results in improvement in reliability of the module, and achieves higher productivity in case of double-sided module.

Figure 6B:
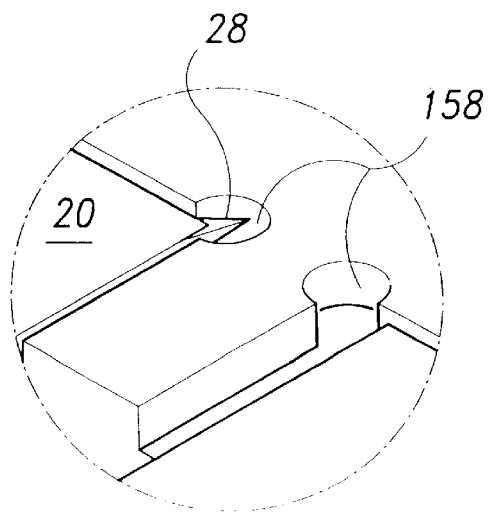

FIGS. 6A and 6B partially show another embodiment of an invented jig carrier 150. Referring to FIGS. 6A and 6B, this embodiment is characterized by hollow corners 158 for receivers 114. To give a full explanation, inside walls 112 and sub-walls 115 which define one of the receivers 114 of the main frame 110 meet at the hollow corners 158. These hollow corners 158 can provide more reliable alignment in cases where a PCB 20 has burrs 28 at its corner. The burrs 28 on the PCB 20 may be formed by the cutting process in the PCB fabrication. There may also be hollow corners 159 in the partition walls 123 of the clamp frame 120.

Another feature of this embodiment lies in the locking holes 156 that has been already introduced hereinbefore. The remaining elements constituting the jig carrier 150 are the same as in the above-described embodiment.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An apparatus for carrying a plurality of printed circuit boards (PCBs) for semiconductor modules, said apparatus comprising: a rectangular main frame formed with an inside space for the plurality of PCBs, said main frame including an inside wall provided with a plurality of receivers corresponding to the PCBs, wherein a first edge of each PCB is accommodated in a respective one of said receivers;

a clamp frame mechanically joined to said main frame by at least one fasteners, said clamp frame having a support plate for a second edge opposite to the first edge of each PCB, and said clamp frame having a fixed wall opposite to said support plate; and one or more movable clamps located in the inside space of said main frame, said movable clamps being elastically connected to said fixed wall of said clamp frame so as to push the second edge of the PCBs toward said receivers of said main frame, whereby the PCBs are fixed by both said movable clamps and said main frame, wherein said main frame provides an adjustable mounting for said fasteners, the adjustable mounting allowing a movement of said fasteners, whereby said apparatus can be adjusted to carry PCBs of different lengths along a third edge of the PCBs.

2. The apparatus according to claim 1, wherein said adjustable mounting is provided in said main frame in parallel sides that are perpendicular to the inside wall containing said receivers of said main frame.

3. The apparatus according to claim 2, wherein said adjustable mounting comprises a locking slot formed in the parallel sides of said main frame.

4. The apparatus according to claim 2, wherein said adjustable mounting comprises a plurality of locking holes formed in the parallel sides of said main frame.

5. The apparatus according to claim 1, wherein the elastic connection between said movable clamps and said clamp frame comprises:

a set of one or more slide bars; and a set of one or more corresponding elastic members, wherein each slide bar is attached to said fixed wall and penetrates a corresponding one of said movable clamps, so that said movable clamps can move along said slide bars, and wherein each elastic member is between said fixed wall of said clamp frame and a corresponding one of said clamps, so that said clamps can push the PCBs by elastic force of said elastic members.

6. The apparatus according to claim 1, wherein said movable clamps move in the direction of said fixed wall of said clamp frame by an opening element when the PCBs are loaded between said support plate of said clamp frame and said receivers of said main frame.

7. The apparatus according to claim 6, wherein each of said movable clamps has at least one clamp holes vertically formed therethrough, and wherein the opening element has plural opening pins to be inserted into corresponding clamp holes of said clamps, so that the opening pins can move said movable clamps by mechanical force.

8. The apparatus according to claim 1, wherein said receivers of said main frame are divided by a plurality of sub-walls provided thereon, whereby a respective one of said sub-walls supports a respective one of the PCBs together with both said inside wall and one of said receivers.

9. The apparatus according to claim 8, wherein said clamp frame comprises a plurality of partition walls provided on said support plate, and wherein each of said partition walls corresponds to each sub-wall, whereby a respective one of said partition walls supports a respective one of the PCBs together with said support plate and said movable clamp.

10. The apparatus according to claim 8, wherein both each inside wall and each sub-wall which define a respective one of said receivers of said main frame are provided with hollow corners.

* * * * *